United States Patent
Sagara et al.

(10) Patent No.: US 9,640,606 B2
(45) Date of Patent: May 2, 2017

(54) ELECTRICITY STORAGE DEVICE AND METHOD FOR MANUFACTURING ELECTRICITY STORAGE DEVICE

(71) Applicant: Panasonic Intellectual Property Management Co., Ltd., Osaka (JP)

(72) Inventors: Akihiko Sagara, Hyogo (JP); Norihito Fujinoki, Osaka (JP); Yuki Nomura, Osaka (JP); Haruhiko Habuta, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/663,266

(22) Filed: Mar. 19, 2015

(65) Prior Publication Data

US 2015/0270329 A1     Sep. 24, 2015

(30) Foreign Application Priority Data

Mar. 24, 2014  (JP) .................................. 2014-060151
Oct. 31, 2014   (JP) .................................. 2014-223010

(51) Int. Cl.
*H01L 21/02*       (2006.01)
*H01L 49/02*       (2006.01)
(Continued)

(52) U.S. Cl.
CPC ............ *H01L 28/60* (2013.01); *H01G 11/56* (2013.01); *H01G 11/84* (2013.01);
(Continued)

(58) Field of Classification Search
None
See application file for complete search history.

(56) References Cited

U.S. PATENT DOCUMENTS

2012/0205615 A1 *  8/2012  Seike .................... B82Y 10/00
                                                     257/9
2012/0244442 A1 *  9/2012  Harada ................. H01M 4/485
                                                     429/221
(Continued)

FOREIGN PATENT DOCUMENTS

CA       2853599       5/2013
WO    2012/046325      4/2012
(Continued)

OTHER PUBLICATIONS

The Extended European Search Report dated Aug. 7, 2015 for the related European Patent Application No. 15158819.1.
(Continued)

*Primary Examiner* — Reema Patel
(74) *Attorney, Agent, or Firm* — McDermott Will & Emery LLP (57) ABSTRACT

An electricity storage device includes a first electrode, a second electrode, an electricity storage layer, and a p-type semiconductor layer. The electricity storage layer is placed between the first electrode and the second electrode. The electricity storage layer contains a mixture of an insulating material and n-type semiconductor particles. The p-type semiconductor layer is placed between the electricity storage layer and the second electrode. The n-type semiconductor particles contain at least one of a titanium-niobium composite oxide and a titanium-tantalum composite oxide.

10 Claims, 2 Drawing Sheets (51) Int. Cl.
  *H01L 21/288*  (2006.01)
  *H01M 14/00*  (2006.01)
  *H01G 11/56*  (2013.01)
  *H01G 11/84*  (2013.01)

(52) U.S. Cl.
  CPC .. *H01L 21/02565* (2013.01); *H01L 21/02628* (2013.01); *H01L 21/02664* (2013.01); *H01L 21/288* (2013.01); *H01M 14/00* (2013.01); *Y02E 60/13* (2013.01)

(56) References Cited

U.S. PATENT DOCUMENTS

| | | | |
|---|---|---|---|
| 2013/0209863 A1 | 8/2013 | Harada et al. | |
| 2013/0224596 A1 | 8/2013 | Nakazawa | |
| 2014/0352775 A1* | 12/2014 | Kudoh | H01M 14/005 136/256 |
| 2016/0036048 A1* | 2/2016 | Naito | H01M 4/366 429/231.1 |

FOREIGN PATENT DOCUMENTS

| | | |
|---|---|---|
| WO | 2013/065093 | 5/2013 |
| WO | 2013/153603 | 10/2013 |

OTHER PUBLICATIONS

De Haart L G J et al: "Photoelectrochemical properties of titanium niobate (TiNb2O7) and titanium tantalate (TiTa2O7)", Materials Chemistry and Physics, Elsevier SA, Switzerland, Taiwan, Republic of China, vol. 13, No. 1, Jul. 1, 1985 (Jul. 1, 1985), pp. 85-90, XP024148504.

* cited by examiner

ELECTRICITY STORAGE DEVICE AND METHOD FOR MANUFACTURING ELECTRICITY STORAGE DEVICE

BACKGROUND

1. Technical Field

The present disclosure relates to an electricity storage device that stores electricity by trapping electrons in an electricity storage layer.

2. Description of the Related Art

In recent years, the awareness of global environmental issues has increased and therefore the creation and use of energy that has a less negative impact on the environment have been required for the purpose of building a sustainable society. Solar and wind power generation techniques are attracting much attention as techniques for creating clean energy. On the other hand, the advance of electricity storage techniques such as secondary batteries and capacitors is expected from the viewpoint of effectively using created energy.

In particular, in the automotive field, the practical use of hybrid and electric vehicles driven by electric motors powered by secondary batteries is being encouraged for the purpose of ensuring energy sources alternative to dwindling fossil fuels and the purpose of reducing the emission of harmful substances such as carbon dioxide. However, the hybrid and electric vehicles have a problem that the hybrid and electric vehicles have a shorter cruising distance as compared to conventional gasoline vehicles. Therefore, the manufacture of secondary batteries with high charge-discharge capacity is expected for the purpose of increasing the cruising distance.

In the mobile device field, secondary batteries with high charge-discharge capacity are required for the purpose of increasing the available time of devices because power consumption is increased due to improved functions. Furthermore, the development of high-capacity capacitors is encouraged for the purpose of storing the energy produced by solar or wind power generation.

Lithium ion batteries and lithium ion capacitors are cited as prime candidates for secondary batteries and capacitors capable of achieving high capacity. However, a current lithium ion battery and lithium ion capacitor have low charge-discharge capacity and therefore the cruising distance of, for example, an electric vehicle equipped with the lithium ion battery or capacitor is very short, about 100 km. An electrolytic solution for use in lithium ion batteries or lithium ion capacitors is liquid, therefore may possibly leak, and has a problem with safety. All-solid-state lithium secondary batteries containing a solid electrolyte instead of an electrolytic solution are under development; however, high capacity has not been attained. Furthermore, these batteries have a problem with high manufacturing costs.

Under such circumstances, a solid-state semiconductor electricity storage device different in operating principle from lithium ion batteries or capacitors has been recently proposed (refer to International Publication No. WO 2012/046325, International Publication No. WO 2013/065093, and the like). The electricity storage device includes an electricity storage layer containing an n-type metal oxide semiconductor particles coated with an insulating material. The operating principle of the electricity storage device is that a new energy level is formed in the electricity storage layer by ultraviolet irradiation and electricity is stored by trapping electrons in the energy level.

The electricity storage device is excellent in safety and can be stably operated because the electricity storage layer is made of an inorganic material. The electricity storage device is simple in manufacture and therefore can be manufactured at low cost. Furthermore, it has been suggested that the capacity per unit volume can be significantly increased by stacking such electricity storage devices (refer to International Publication No. WO 2013/153603).

SUMMARY

One non-limiting and exemplary embodiment provides an electricity storage device with high charge-discharge capacity.

In one general aspect, the techniques disclosed here feature an electricity storage device including a first electrode, a second electrode, an electricity storage layer which is placed between the first electrode and the second electrode and which contains a mixture of an insulating material and n-type semiconductor particles, and a p-type semiconductor layer placed between the electricity storage layer and the second electrode. The n-type semiconductor particles contain at least one of a titanium-niobium composite oxide and a titanium-tantalum composite oxide.

It should be noted that general or specific embodiments may be implemented as a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

In a conventional solid-state semiconductor electricity storage device, an n-type metal oxide semiconductor material used to form an electricity storage layer is titanium dioxide. However, in the case of using titanium dioxide as an n-type semiconductor material, charge-discharge capacity is limited. Thus, an electricity storage device with charge-discharge capacity higher than or equal to that of titanium dioxide is required to be developed for the purpose of achieving higher capacity.

Secondary batteries described in International Publication Nos. WO 2012/046325, WO 2013/065093, and WO 2013/153603 include an electricity storage layer containing an n-type metal oxide semiconductor such as titanium dioxide, tin oxide, or zinc oxide. However, the secondary batteries described in International Publication Nos. WO 2012/046325, WO 2013/065093, and WO 2013/153603 have a problem with low capacity. The present inventors tried using other metal oxides instead of the n-type metal oxide semiconductors contained in conventional electricity storage layers, and achieved a high-capacity secondary battery (electricity storage device).

The present disclosure provides an electricity storage device including a first electrode, a second electrode, an electricity storage layer which is placed between the first electrode and the second electrode and which contains a mixture of an insulating material and n-type semiconductor particles, and a p-type semiconductor layer placed between the electricity storage layer and the second electrode. The n-type semiconductor particles contain at least one of a titanium-niobium composite oxide and a titanium-tantalum composite oxide.

According to the present disclosure, the electricity storage device has an increased charge-discharge capacity. That is, since the n-type semiconductor particles, which are contained in the electricity storage layer, contain at least one of the titanium-niobium composite oxide and the titanium-tantalum composite oxide, discharge properties of the electricity storage device can be enhanced.

The n-type semiconductor particles may contain the titanium-niobium composite oxide as an essential component.

The sum of the content of titanium, the content of niobium, and the content of oxygen in the titanium-niobium composite oxide may be 80 atomic percent or more. According to the titanium-niobium composite oxide, discharge properties of the electricity storage device can be enhanced.

Alternatively, the n-type semiconductor particles may contain the titanium-tantalum composite oxide as an essential component.

The sum of the content of titanium, the content of tantalum, and the content of oxygen in the titanium-tantalum composite oxide may be 80 atomic percent or more. According to the titanium-tantalum composite oxide, discharge properties of the electricity storage device can be enhanced.

The first or second electrode may be made of at least one selected from the group consisting of silver, copper, gold, iron, aluminum, nickel, titanium, chromium, and molybdenum; an alloy of any selective combination of these metals; or a conductive oxide.

The p-type semiconductor layer may contain a p-type oxide semiconductor. According to the p-type oxide semiconductor, the effect of preventing electrons from migrating from the second electrode to the electricity storage layer can be sufficiently obtained.

The p-type oxide semiconductor may be nickel oxide or a copper-aluminum oxide. According to nickel oxide or the copper-aluminum oxide, the effect of preventing electrons from migrating from the second electrode to the electricity storage layer can be sufficiently obtained.

The insulating material may be an insulating resin or an inorganic insulator.

The insulating resin may be silicone. The inorganic insulator may be silicon dioxide.

The present disclosure provides a method for manufacturing an electricity storage device including a first electrode, electricity storage layer, p-type semiconductor layer, and second electrode stacked in that order. The method includes preparing a coating solution by dissolving an organic acid titanium salt, an organic acid niobium salt, and an insulating material in a solvent; forming a coating film by applying the coating solution to the first electrode; firing the coating film; forming the electricity storage layer by irradiating the fired coating film with light; and forming the p-type semiconductor layer and the second electrode in that order after the formation of the electricity storage layer.

Furthermore, the present disclosure provides a method for manufacturing an electricity storage device including a first electrode, electricity storage layer, p-type semiconductor layer, and second electrode stacked in that order. The method includes preparing a coating solution by dissolving an organic acid titanium salt, an organic acid tantalum salt, and an insulating material in a solvent; forming a coating film by applying the coating solution to the first electrode; firing the coating film; forming the electricity storage layer by irradiating the fired coating film with light; and forming the p-type semiconductor layer and the second electrode in that order after the formation of the electricity storage layer.

In accordance with the methods for manufacturing the electricity storage devices according to the present disclosure, the electricity storage devices according to the present disclosure can be efficiently obtained.

The present disclosure is described below with reference to the attached drawings. The present disclosure is not limited to embodiments below.

Figure 1:
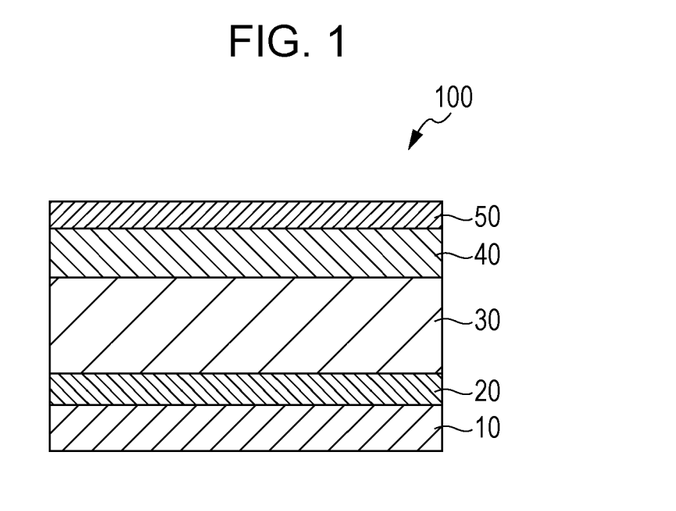
FIG. 1 is a sectional view of an electricity storage device according to an embodiment of the present disclosure.

As shown in FIG. 1, an electricity storage device 100 according to an embodiment of the present disclosure includes a first electrode 20, an electricity storage layer 30, a p-type semiconductor layer 40, and a second electrode 50. The electricity storage layer 30, the p-type semiconductor layer 40, and the second electrode 50 are stacked on the first electrode 20 in that order. The first electrode 20 may double as a substrate. Alternatively, a substrate 10 may be placed in addition to the first electrode 20 as shown in FIG. 1. The electricity storage layer 30, the p-type semiconductor layer 40, and the second electrode 50 are stacked on the first electrode 20 in that order as described above. On the contrary, the p-type semiconductor layer 40, the electricity storage layer 30, and the first electrode 20 may be stacked on the second electrode 50 in that order.

The substrate 10 may be made of an insulating material or a conductive material. The substrate 10 may be, for example, one of a glass substrate, a semiconductor substrate, a metal substrate, a ceramic substrate, a plastic substrate, a film, a resin substrate, and a metal sheet or any selective combination thereof. The substrate 10 may be rigid or flexible. The substrate 10 may be a flexible sheet. In this case, the substrate 10 can be used in a curved portion or can be used for bendable applications.

The first electrode 20 and the second electrode 50 are not particularly limited and may contain a conductive material. The conductive material may be one of metal, a conductive oxide, a conductive resin, and a conductive carbon material or any selective combination of these materials.

The metal may be one of silver, copper, gold, iron, aluminum, magnesium, tungsten, cobalt, zinc, nickel, platinum, tin, chromium, lead, titanium, and molybdenum or an alloy of any selective combination of these metals. The alloy may be stainless steel, brass or the like.

The conductive oxide may be one of indium oxide, tin oxide, zinc oxide, and antimony oxide or a mixture of any selective combination of these oxides. Tin-doped indium oxide (i.e. indium tin oxide (ITO)) can be used to form a transparent electrode. The transparent electrode is not limited to ITO and can be made from one of tin oxide and zinc oxide or a mixture thereof.

The conductive resin may be one of polyacetylene, polythiophene, polyaniline, polypyrrole, polyparaphenylene, polyparaphenylenevinylene, polyfluorene, polythienylenevinylene, polyethylenedioxythiophene, and polyacene or a mixture of any selective combination of these polymers.

The conductive carbon material may be one of carbon black, carbon nanotubes, conductive diamond, and conductive graphite or any selective combination of these materials.

In the case of using the conductive material to form the substrate 10, the substrate 10 can be used instead of the first electrode 20 without forming the first electrode 20.

The thickness of the first electrode 20 ranges from, for example, 20 nm to 1 μm. The thickness of the second electrode 50 ranges from, for example, 20 nm to 1 μm.

Figure 2:
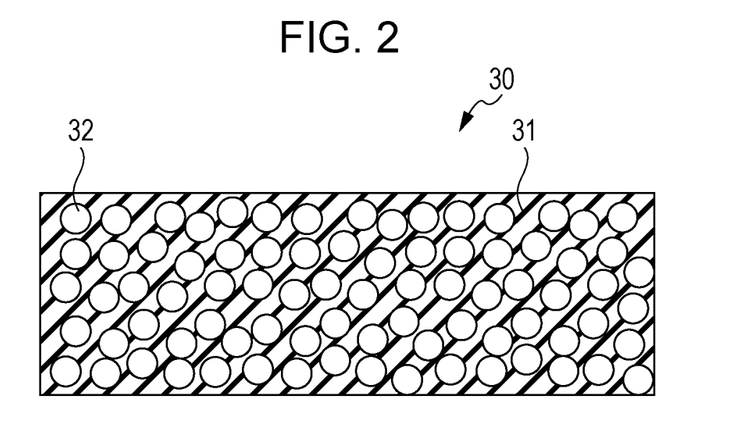
FIG. 2 is an illustration showing the structure of an electricity storage layer of the electricity storage device shown in FIG. 1.

FIG. 2 shows a cross section of the electricity storage layer 30. The electricity storage layer 30 is made of a mixture of an insulating material 31 and n-type semiconductor particles 32. In other words, the electricity storage layer 30 contains the insulating material 31 and the n-type semiconductor particles 32 embedded in the insulating material 31.

The insulating material 31 functions as a barrier to electrons trapped in the n-type semiconductor particles 32 and therefore desirably has a band gap wider than that of the n-type semiconductor particles 32. The insulating material 31 may be one of an insulating resin and an inorganic insulator or a mixture thereof.

The insulating resin may be one of silicone, polyethylene, polypropylene, polystyrene, polybutadiene, polyvinyl chloride, polyester, polymethyl methacrylate, polyamide, polycarbonate, polyacetal, polyimide, ethyl cellulose, cellulose acetate, a phenol resin, an amino resin, an unsaturated polyester resin, an acrylic resin, an allyl resin, an alkyd resin, an epoxy resin, a melamine resin, a urea resin, a vinylidene chloride resin, an ABS resin, polyurethane, neoprene, Celluloid, polyvinyl formal, a silicon resin, and a melting fluororesin or a mixture of any selective combination of these materials. The insulating resin is desirably silicone. The insulating resin may be a thermoplastic or thermosetting resin.

The inorganic insulator may be one of an oxide, a nitride, an oxynitride, mineral oil, and paraffin or a mixture of any selective combination of these materials. The oxide may be one of metal oxides such as silicon dioxide ($SiO_2$), magnesium oxide (MgO), aluminum oxide ($Al_2O_3$), titanium oxide ($TiO_2$ or $TiO_3$), gallium oxide ($Ga_2O_3$), tantalum oxide ($T_2O_5$), zirconium oxide ($ZrO_2$), hafnium oxide ($HfO_2$), and chromium oxide (CrO, $Cr_2O_3$, $CrO_2$, $CrO_3$, or $CrO_5$) or a mixture of any selective combination of the metal oxides. The metal oxide may be typically one of silicon dioxide, magnesium oxide, and aluminum oxide or a mixture of any selective combination of these oxides. The nitride may be one of metal nitrides such as germanium nitride ($Ge_3N_4$), chromium nitride (CrN), silicon nitride ($Si_3N_4$), aluminum nitride (AlN), niobium nitride (NbN), molybdenum nitride (MoN), titanium nitride (TiN), zirconium nitride (ZrN), and tantalum nitride (TaN) or a mixture of any selective combination of the metal nitrides. The oxynitride may be one of metal oxynitrides such as germanium oxynitride (GeON), chromium oxynitride ($CrO_xN_y$), silicon oxynitride ($SiO_xN_y$), aluminum oxynitride ($AlO_xN_y$), niobium oxynitride ($NbO_xN_y$), molybdenum oxynitride ($MoO_xN_y$), titanium oxynitride ($TiO_xN_y$), zirconium oxynitride ($ZrO_xN_y$), and tantalum oxynitride ($TaO_xN_y$) or a mixture of any selective combination of the metal oxynitrides. The inorganic insulator may be a silicon oxide (for example, silicon dioxide ($SiO_2$) or silicon oxynitride ($SiO_xN_y$)) containing Si and O.

The n-type semiconductor particles 32 contain at least one of (a) a material containing titanium, niobium, and oxygen and (b) a material containing titanium, tantalum, and oxygen. In particular, the n-type semiconductor particles 32 contain at least one of a titanium-niobium composite oxide and a titanium-tantalum composite oxide. The proportion of each element in the titanium-niobium composite oxide is not particularly limited as long as the electricity storage layer 30 exhibits a charge-discharge function. Likewise, the proportion of each element in the titanium-tantalum composite oxide is not particularly limited.

The sum of the content of titanium and the content of niobium in the material containing titanium, niobium, and oxygen (for example, the titanium-niobium composite oxide) is desirably 80 atomic percent or more. The sum of the content of titanium and the content of tantalum in the material containing titanium, tantalum, and oxygen (for example, the titanium-tantalum composite oxide) is desirably 80 atomic percent or more.

The titanium-niobium composite oxide may be a material containing titanium, niobium, oxygen, and $M^1$ ($M^1$ is an element that is at least one selected from the group consisting of tantalum, tin, and zinc). The titanium-tantalum composite oxide may be a material containing titanium, tantalum, oxygen, and $M^2$ ($M^2$ is an element that is at least one selected from the group consisting of niobium, tin, and zinc).

The titanium-niobium composite oxide may be substantially made of titanium, niobium, and oxygen. In other words, the n-type semiconductor particles 32 may be substantially made of titanium, niobium, and oxygen. The titanium-tantalum composite oxide may be substantially made of titanium, tantalum, and oxygen. In other words, the n-type semiconductor particles 32 may be substantially made of titanium, tantalum, and oxygen. The term "substantially made of" as used herein means that another element may be contained within a range (for example, 5 atomic percent or less, 1 atomic percent or less, or 0.1 atomic percent or less) not significantly affecting material properties.

When the n-type semiconductor particles 32 contain only a small amount of niobium or tantalum, the n-type semiconductor particles 32 have the effect of increasing the charge-discharge capacity of the electricity storage device 100. The weight ratio of titanium to niobium (Ti:Nb) desirably ranges from, for example, 95:5 to 5:95 and more desirably 50:50 to 30:70. The weight ratio of tantalum to niobium (Ti:Ta) desirably ranges from, for example, 95:5 to 5:95 and more desirably 50:50 to 30:70.

The thickness of the electricity storage layer 30 ranges from, for example, 100 nm to 10 μm.

The n-type semiconductor particles 32, which are contained in the electricity storage layer 30, desirably have an average size of 1 nm to 20 nm, more desirably 1 nm to 10 nm, and further more desirably 1 nm to 6 nm. The average size of the n-type semiconductor particles 32 can be calculated by a method below. The n-type semiconductor particles 32 are observed with an electron microscope (SEM or TEM). The area S of a specific one of the n-type semiconductor particles 32 in an obtained image is determined. The size a of this n-type semiconductor particle 32 is calculated by the following equation:

$$a=2\times(S/3.14)^{1/2}.$$

The sizes a of randomly selected 50 of the n-type semiconductor particles 32 are calculated and the average thereof is defined as the average size of primary particles of the n-type semiconductor particles 32.

The n-type semiconductor particles 32 are desirably fine particles. The n-type semiconductor particles 32 exhibit n-type semiconductor properties. The electricity storage layer 30 desirably has a structure in which the n-type semiconductor particles 32 are dispersed in a matrix of the insulating material 31.

The ratio of the insulating material 31 to the n-type semiconductor particles 32, which are contained in the electricity storage layer 30, is not particularly limited. The weight ratio of the insulating material 31 to the n-type semiconductor particles 32 ranges from, for example, 1:99 to 99:1.

The p-type semiconductor layer 40 is placed for the purpose of preventing the injection of electrons from the second electrode 50. The p-type semiconductor layer 40 can be made from, for example, a p-type oxide semiconductor. The p-type oxide semiconductor may be one of a nickel oxide, a copper oxide, a copper-aluminum oxide, and a tin oxide or a material containing a mixture of any selective combination of these oxides. The thickness of the p-type semiconductor layer 40 ranges from, for example, 20 nm to 1 μm.

The electricity storage layer 30 and the p-type semiconductor layer 40 may be interposed between the first electrode 20 and the second electrode 50. The stacking order of the electricity storage layer 30 and the p-type semiconductor layer 40 may be reversed. In this embodiment, the electricity storage layer 30 is in contact with the first electrode 20 and the p-type semiconductor layer 40 is in contact with the electricity storage layer 30. The p-type semiconductor layer 40 is placed opposite to the first electrode 20 as viewed from the electricity storage layer 30. The second electrode 50 is in contact with the p-type semiconductor layer 40. The second electrode 50 is placed opposite to the electricity storage layer 30 as viewed from the p-type semiconductor layer 40. Incidentally, an intermediate layer may be placed between these layers unless charge-discharge operation is significantly disturbed.

The charge-discharge mechanism of the electricity storage device 100 is considered as described below. When a negative voltage is applied to the first electrode 20 on the basis of the second electrode 50, electrons migrate from the first electrode 20 to the n-type semiconductor particles 32. The electrons migrating to the n-type semiconductor particles 32 are trapped in an energy level (herein after also referred to as "the electron-trapping level") formed in the n-type semiconductor particles 32. The trapped electrons are prevented by the p-type semiconductor layer 40 from migrating and therefore remain trapped by the n-type semiconductor particles 32, resulting in the state of charge. Since this state is maintained after the application of a bias voltage is stopped, the function of the electricity storage device 100 is maintained. When a load is connected between the first electrode 20 and the second electrode 50, the electrons trapped in the electron-trapping level in the n-type semiconductor particles 32 flow to the load. This is the state of discharge. This state continues until the electrons trapped in the electron-trapping level in the n-type semiconductor particles 32 are lost and return to a state before charge. The above is the basic charge-discharge principle of the electricity storage device 100. The repetition of this phenomenon allows the electricity storage device 100 to be used as a secondary battery and a capacitor.

Figure 3:
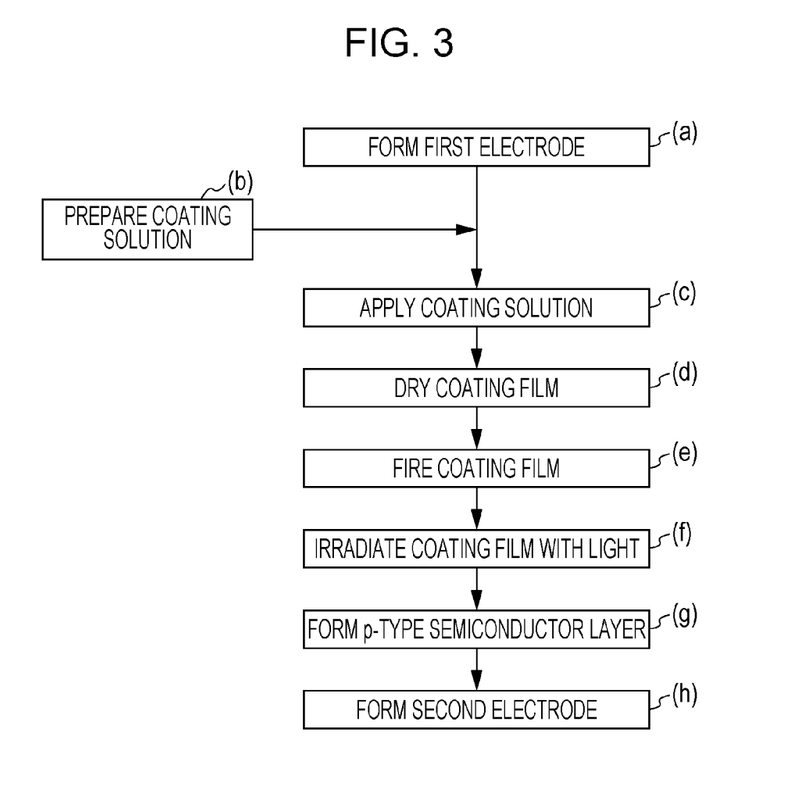
FIG. 3 is a flowchart of a method for manufacturing the electricity storage device shown in FIG. 1.

A method for manufacturing an electricity storage device according to an embodiment of the present disclosure is described below. FIG. 3 is a flowchart illustrating a method for manufacturing the electricity storage device 100 shown in FIG. 1.

In Step (a), the first electrode 20 is formed on the substrate 10. In the case of using metal to form the first electrode 20, the first electrode 20 can be formed by a process such as a sputtering process, a vacuum evaporation process, a pulsed laser deposition process (PLD process), a chemical vapor deposition process (CVD process), an electroplating process, an atomic layer deposition process (ALD process), a thermal spray process, a cold spray process, or an aerosol deposition process. Alternatively, the first electrode 20 can be formed by a coating process such as a spin coating process, a dip coating process, a bar coating process, a level coating process, or a spray coating process. A process for forming the first electrode 20 is not limited to these processes. When the substrate 10 is made of a conductivity material, the substrate 10 can be used as an electrode without forming the first electrode 20.

A process for forming the electricity storage layer 30 is described below. In Step (b), a coating solution is prepared by dissolving an organic acid titanium salt, an organic acid niobium salt, and an insulating material in a solvent. Alternatively, a coating solution is prepared by dissolving the organic acid titanium salt, an organic acid tantalum salt, and the insulating material in the solvent. A mixture of these coating solutions can be used.

An organic acid for forming the organic acid titanium salt, the organic acid niobium salt, or the organic acid tantalum salt (hereinafter also referred to as "the metal salt of the organic acid") is one capable of producing the titanium-niobium composite oxide or the titanium-tantalum composite oxide by decomposing or combusting the metal salt of the organic acid by firing. The organic acid may be an aliphatic acid or an aromatic acid.

The aliphatic acid may be an aliphatic carboxylic acid. The aliphatic carboxylic acid may be an aliphatic monocarboxylic acid or an aliphatic polycarboxylic acid. The aliphatic polycarboxylic acid may be one of an aliphatic dicarboxylic acid, an aliphatic tricarboxylic acid, and an aliphatic tetracarboxylic acid or any selective combination of these acids. The aliphatic monocarboxylic acid may be one of formic acid, acetic acid, propionic acid, butyric acid, valeric acid, hexanoic acid, heptanoic acid, nonanoic acid, caprylic acid, pelargonic acid, capric acid, lauric acid, myristic acid, palmitic acid, margaric acid, stearic acid, acrylic acid, butenoic acid, crotonic acid, isocrotonic acid, linolenic acid, oleic acid, linoleic acid, arachidonic acid, docosahexaenoic acid, eicosapentaenoic acid, pyruvic acid, and lactic acid or any selective combination of these acids. Among these acids, a highly unsaturated aliphatic acid is preferred. The highly unsaturated aliphatic acid is an aliphatic acid having four or more unsaturated bonds. The aliphatic dicarboxylic acid may be one of oxalic acid, malonic acid, succinic acid, glutaric acid, adipic acid, maleic acid, fumaric acid, tartaric acid, and malic acid or any selective combination of these acids. The aliphatic tricarboxylic acid may be citric acid or the like. The aliphatic tetracarboxylic acid may be 1,2,3,4-butanetetracarboxylic acid or the like. Metal salts of these aliphatic acids may be used alone or in combination.

The aromatic acid may be an aromatic carboxylic acid. The aromatic carboxylic acid may be one of an aromatic monocarboxylic acid and an aromatic polycarboxylic acid or a mixture thereof. The aromatic polycarboxylic acid may be one of an aromatic dicarboxylic acid, an aromatic tricarboxylic acid, an aromatic tetracarboxylic acid, and an aromatic hexacarboxylic acid or a mixture of any selective combination of these acids. The aromatic monocarboxylic acid may be one of benzoic acid, salicylic acid, cinnamic acid, and gallic acid or a mixture of any selective combination of these acids. The aromatic dicarboxylic acid may be phthalic acid, isophthalic acid, or terephthalic acid. The aromatic tricarboxylic acid may be trimellitic acid. The aromatic tetracarboxylic acid may be pyromellitic acid. The aromatic hexacarboxylic acid may be mellitic acid. Metal salts of these aromatic acids may be used alone or in combination.

The solvent may be one capable of dissolving the metal salt of the organic acid and the insulating material 31. The solvent may be, for example, one of a hydrocarbon solvent, an alcohol solvent, an ester solvent, an ether solvent, and a ketone solvent or a mixture of any selective combination of these solvents. In particular, the solvent may be one of ethanol, xylene, butanol, acetylacetone, ethyl acetoacetate, and methyl acetoacetate or a mixture of any selective combination of these compounds.

In Step (c), the coating solution is applied to the first electrode 20, whereby a coating film is formed on the first electrode 20. A process for applying the coating solution to the first electrode 20 may be a spin coating process, a spray coating process, a roller coating process, a wire-bar coating process, a die coating process, a blade coating process, an ink jet process, or the like.

In Step (d), the coating film is dried such that the solvent is properly removed from the coating film, which is placed on the first electrode 20. The coating film may be dried at room temperature or may be dried by heating the coating film to a temperature higher than room temperature. When the solvent in the coating film is highly volatile, Step (d) may be omitted.

In Step (e), the coating film is fired. The metal salt of the organic acid contained in the coating film is decomposed or combusted by firing, whereby a layer of the insulating material 31 and the n-type semiconductor particles 32 are formed. In particular, the insulating material 31 and the n-type semiconductor particles 32 are formed such that the n-type semiconductor particles 32 are dispersed in the insulating material 31. The coating film is fired at a temperature of, for example, 300° C. to 500° C. for 10 minutes to 1 hour.

In Step (f), in order to form the electron-trapping level in the in the n-type semiconductor particles 32, the coating film is irradiated with light, whereby the coating film is converted into the electricity storage layer 30. The light applied to the coating film may be an ultraviolet ray, which has high photon energy. An ultraviolet irradiator used may be a low-pressure mercury lamp, a high-pressure mercury lamp, or a metal halide lamp. In order to form the electron-trapping level in the in the n-type semiconductor particles 32 by irradiating the coating film with the ultraviolet ray, the irradiation intensity is set to 20 mW/cm$^2$ or more and the irradiation time is set to 5 minutes or more in the case of setting the irradiation wavelength to, for example, 254 nm. Conditions for applying the ultraviolet ray may include an irradiation wavelength of 254 nm, an irradiation intensity of 100 mW/cm$^2$, and an irradiation time of 12 hours or less. Step (f) allows electrons to be trapped in the electricity storage layer 30, that is, electricity to be stored in the electricity storage layer 30.

In Step (g), the p-type semiconductor layer 40 is formed on the electricity storage layer 30. A process for forming the p-type semiconductor layer 40 may be a sputtering process, an ion plating process, an electron beam evaporation process, a vacuum evaporation process, a chemical vapor deposition process, a chemical vapor growth process, or a coating process.

In Step (h), the second electrode 50 is formed on the p-type semiconductor layer 40. A process for forming the second electrode 50 may be the same as the process for forming the first electrode 20.

Through the above steps, the electricity storage device 100 is obtained as described with reference to FIGS. 1 and 2. The first electrode 20, the electricity storage layer 30, the p-type semiconductor layer 40, and the second electrode 50 are stacked on the substrate 10 in that order as shown in FIG. 1. The stacking order of these members may be reversed. That is, the second electrode 50, the p-type semiconductor layer 40, the electricity storage layer 30, and the first electrode 20 may be stacked on the substrate 10 in that order.

The shape of the electricity storage device 100 is, for example, rectangular as described in an example below. The shape of the electricity storage device 100 is not limited to a rectangular shape ad may be a circular shape, an oval shape, or another shape. Electricity storage devices according to the present disclosure may be formed on both the front and back surfaces of a substrate. Furthermore, high capacity can be achieved by stacking electricity storage devices according to the present disclosure in a thickness direction. The electricity storage device 100 may be foldable or retractable so as to take various shapes depending on forms used and applications. The appearance of the electricity storage device 100 may take a desired form such as a cylindrical form, a prismatic form, a button form, a coin form, or a flat form. The form of the electricity storage device 100 is not limited to the above forms.

EXAMPLES

The present disclosure is further described below in detail with reference to examples. The present disclosure is not limited to the examples.

Example 1

An electricity storage device was prepared using a stainless steel substrate having a 3 cm square surface and a thickness of 0.4 mm. No first electrode was formed. The stainless steel substrate doubled as an electrode. In an electricity storage layer, silicone was used as an insulating material and particles of a titanium-niobium composite oxide were used as n-type semiconductor particles. A process for preparing the electricity storage layer is described below in detail. First, a coating solution was prepared in such a manner that titanium heptanoate, niobium heptanoate, and silicone oil were mixed with xylene, which is a solvent, followed by stirring. The weight ratio of titanium to niobium in the coating solution was 40:60. Next, a spin coater was prepared and the coating solution was applied to the stainless steel substrate while the stainless steel substrate was being rotated, whereby a coating film was formed. In this operation, the number of revolutions of the stainless steel substrate was set to 1,200 rpm. Next, the coating film was left at 50° C. for about 10 minutes and was thereby dried. Thereafter, the coating film was fired at 420° C. for 10 minutes. Through these steps, titanium heptanoate and niobium heptanoate were decomposed, whereby the titanium-niobium composite oxide particles were formed so as to be dispersed in a silicone insulating film. The coating film, which was prepared under the above conditions, had a thickness of about 1 µm. Next, the coating film was irradiated with an ultraviolet ray using a metal halide lamp. The wavelength of the ultraviolet ray was 254 nm. The irradiation intensity was set to 130 mW/cm$^2$ and the irradiation time was set to 90 minutes. The above is the process for preparing the electricity storage layer.

Next, a nickel oxide film as a p-type semiconductor layer was formed on the electricity storage layer by a sputtering process. The thickness of the nickel oxide film was 100 nm. Finally, an aluminum film as a second electrode was formed on the p-type semiconductor layer by a sputtering process aluminum, whereby an electricity storage device was prepared. The thickness of the nickel oxide film was 300 nm.

Example 2

A substrate made of stainless steel, which is a conductive metal, was used. The substrate had a 3 cm square surface and a thickness of 0.4 mm. Since the substrate was capable of functioning as a first electrode, no first electrode was formed. In an electricity storage layer, silicone was used as an insulating material and particles of a titanium-niobium composite oxide were used as n-type semiconductor particles. A process for preparing the electricity storage layer is described below in detail. First, a coating solution was prepared in such a manner that titanium heptanoate, niobium heptanoate, and silicone oil were mixed with xylene, which is a solvent, followed by stirring. Next, a spin coater was prepared and the coating solution was applied to the substrate while the substrate was being rotated, whereby a coating film was formed. In this operation, the number of revolutions of the substrate was set to 1,200 rpm. Next, the coating film was left at 50° C. for about 10 minutes and was thereby dried. Thereafter, the coating film was fired at 500° C. for 60 minutes. Through these steps, titanium heptanoate and niobium heptanoate were decomposed, whereby the titanium-niobium composite oxide particles (n-type semiconductor particles) were formed so as to be dispersed in a silicone insulating film. The coating film, which was prepared under the above conditions, had a thickness of about 1 μm. Next, the coating film was irradiated with an ultraviolet ray using a metal halide lamp. In this operation, the wavelength of the ultraviolet ray was 254 nm, the irradiation intensity was set to 70 mW/cm², and the irradiation time was set to 120 minutes. The above is the process for preparing the electricity storage layer.

Next, a p-type semiconductor layer was formed on the electricity storage layer by a sputtering process using nickel oxide. The thickness of the p-type semiconductor layer was 300 nm. Finally, a second electrode was formed on the p-type semiconductor layer by a sputtering process using tungsten. The thickness of the second electrode was 150 nm.

The coating solution was one of three types of coating solutions that were prepared in such a manner that the mixing ratio of titanium heptanoate to niobium heptanoate was varied such that the weight ratio of titanium heptanoate to niobium heptanoate was 40:60, 60:40, or 80:20. Three types of electricity storage devices were prepared using these coating solutions.

Example 3

In Example 3, an electricity storage device was prepared by substantially the same method as that used in Example 2 using substantially the same materials as those used in Example 2 except that tantalum heptanoate was used instead of niobium heptanoate. The weight ratio of titanium to tantalum in a coating solution was 80:20. Titanium-tantalum composite oxide particles (n-type semiconductor particles) were formed by firing the coating solution so as to be dispersed in a silicone insulating film.

Comparative Example 1

In Comparative Example 1, an electricity storage device was prepared by substantially the same method as that used in Example 1 using substantially the same materials as those used in Example 1 except that niobium heptanoate was not used.

Comparative Example 2

In Comparative Example 2, an electricity storage device was prepared by substantially the same method as that used in Example 2 using substantially the same materials as those used in Example 2 except that niobium heptanoate was not used.

Measurement of Discharge Capacity

The electricity storage devices prepared in Example 1 and Comparative Example 1 were evaluated for discharge properties by a method below. First, a voltage of −2 V was applied to the substrate of each electricity storage device for 5 minutes in advance, whereby the electricity storage device was charged. Thereafter, the electricity storage device was discharged at a constant current of 50 nA. Next, a value obtained by multiplying the current flowing during discharge by the discharge time, that is, the time taken for the voltage of the electricity storage device to drop to zero during discharge was defined as discharge capacity (nAh) and the discharge capacity of the electricity storage device was calculated. Furthermore, a value obtained by multiplying the current flowing during discharge by the voltage during discharge and the discharge time, that is, the time taken for the voltage of the electricity storage device to drop to zero during discharge was defined as discharge energy (μWh) and the discharge energy of the electricity storage device was calculated.

Higher discharge capacity and higher discharge energy mean more excellent discharge properties. Table 1 shows discharge capacity and energy measurements.

TABLE 1

|  | Weight ratio of titanium to niobium | Discharge capacity (nAh) | Discharge energy (μWh) |
| --- | --- | --- | --- |
| Example 1 | 40:60 | 99 | 8.55 |
| Comparative Example 1 | 100:0 | 53 | 0.94 |

As is clear from Table 1, the electricity storage device prepared in Example 1 has higher discharge capacity and energy as compared to the electricity storage device prepared in Comparative Example 1. That is, the use of a titanium-niobium composite oxide as a material for an electricity storage layer enables discharge properties to be enhanced as compared to those of electricity storage devices including an electricity storage layer made of titanium dioxide.

Figure 4:
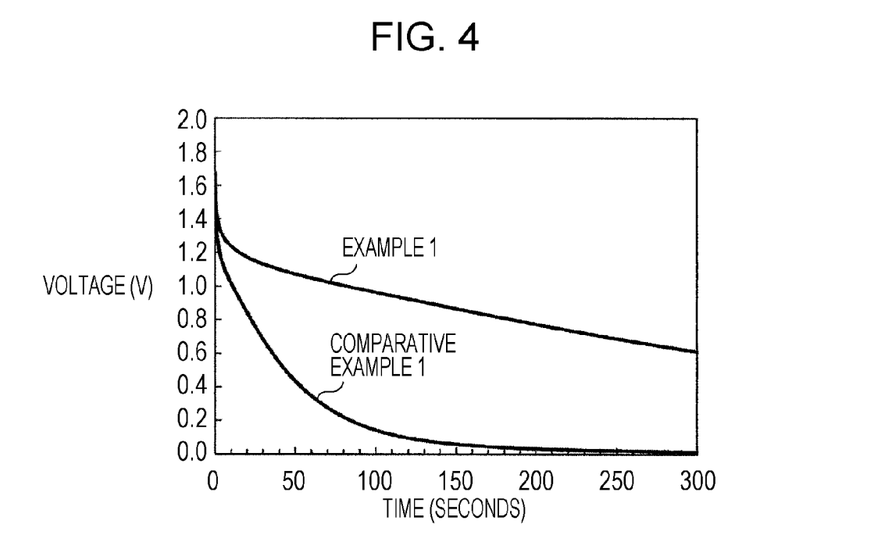
FIG. 4 is a graph showing the temporal change in voltage of each of the electricity storage devices prepared in Example 1 and Comparative Example 1 during discharge.

FIG. 4 is a graph showing the temporal change in voltage of each of the electricity storage devices prepared in Example 1 and Comparative Example 1 during discharge. The voltage of the electricity storage device prepared in Comparative Example 1 drops sharply during discharge. However, the voltage of the electricity storage device prepared in Example 1 drops more moderately than the voltage of the electricity storage device prepared in Comparative Example 1.

The electricity storage devices prepared in Examples 2 and 3 and Comparative Example 2 were evaluated for discharge properties by a method below. First, a voltage of −2 V was applied to the substrate of each electricity storage device for 5 minutes in advance, whereby the electricity storage device was charged. Thereafter, the electricity storage device was discharged at a constant current of 50 μA. Table 2 shows discharge energy measurements.

TABLE 2

|  | Weight ratio of titanium to niobium | Weight ratio of titanium to tantalum | Discharge energy (μWh) |
| --- | --- | --- | --- |
| Example 2 | 40:60 | — | 1.44 |
|  | 60:40 | — | 2.31 |
|  | 80:20 | — | 2.22 |
| Example 3 | — | 80:20 | 1.98 |
| Comparative Example 2 | 100:0 | — | 1.32 |

As is clear from Table 2, the electricity storage devices prepared in Examples 2 and 3 have higher discharge energy as compared to the electricity storage device prepared in Comparative Example 2. That is, the use of a titanium-niobium composite oxide or a titanium-tantalum composite oxide as a material for an electricity storage layer enables discharge properties to be enhanced as compared to those of electricity storage devices including an electricity storage layer made of titanium dioxide.

An electricity storage device according to the present disclosure includes an electricity storage layer made of an inorganic material. Therefore, the electricity storage device is excellent in safety and can be stably operated. The electricity storage device is simple in manufacture and therefore can be manufactured at low cost. Furthermore, the electricity storage device can be increased in discharge capacity as compared to conventional electricity storage devices including an electricity storage layer containing n-type semiconductor particles made of titanium dioxide. Accordingly, the electricity storage device is useful in manufacturing a hybrid or electric vehicle having a long cruising distance, a mobile system capable of being used for a long time, or the like.

What is claimed is:

1. An electricity storage device comprising:
   a first electrode;
   a second electrode;
   an electricity storage layer which is placed between the first electrode and the second electrode and which contains a mixture of an insulating material and n-type semiconductor particles; and
   a p-type semiconductor layer placed between the electricity storage layer and the second electrode,
   wherein the n-type semiconductor particles contain at least one of the group consisting of a titanium-niobium composite oxide and a titanium-tantalum composite oxide,
   the n-type semiconductor particles have an average size of 1 nm to 20 nm, and
   the average size is an average of value a of fifty n-type semiconductor particles, where value α of one of the fifty n-type semiconductor particles is $2\times(S/3.14)^{1/2}$ and S is an area of the one of the fifty n-type semiconductor particles in an image observed with an electron microscope.

2. The electricity storage device according to claim 1, wherein the n-type semiconductor particles contain the titanium-niobium composite oxide as an essential component.

3. The electricity storage device according to claim 1, wherein the n-type semiconductor particles contain a titanium-niobium composite oxide, the sum of the content of titanium, the content of niobium, and the content of oxygen in the titanium-niobium composite oxide is 80 atomic percent or more.

4. The electricity storage device according to claim 1, wherein the n-type semiconductor particles contain the titanium-tantalum composite oxide as an essential component.

5. The electricity storage device according to claim 1, wherein the n-type semiconductor particles contain a titanium-tantalum composite oxide, the sum of the content of titanium, the content of tantalum, and the content of oxygen in the titanium-tantalum composite oxide is 80 atomic percent or more.

6. The electricity storage device according to claim 1, wherein the first or second electrode is made of at least one selected from the group consisting of silver, copper, gold, iron, aluminum, nickel, titanium, chromium, and molybdenum; an alloy of any selective combination of these metals; or a conductive oxide.

7. The electricity storage device according to claim 1, wherein the p-type semiconductor layer contains a p-type oxide semiconductor.

8. The electricity storage device according to claim 7, wherein the p-type oxide semiconductor is nickel oxide or a copper-aluminum oxide.

9. The electricity storage device according to claim 1, wherein the insulating material is an insulating resin or an inorganic insulator.

10. The electricity storage device according to claim 1, wherein the insulating material is silicone or silicon dioxide.

* * * * *